United States Patent
Huang

(10) Patent No.: US 7,436,669 B2
(45) Date of Patent: Oct. 14, 2008

(54) 3D MULTI-LAYER HEAT CONDUCTION DIFFUSION PLATE

(76) Inventor: Sung-Po Huang, P.O. Box. No. 6-57, Junghe, Taipei 235 (TW)

(*) Notice: Subject to any disclaimer, the term of this patent is extended or adjusted under 35 U.S.C. 154(b) by 290 days.

(21) Appl. No.: 11/126,206

(22) Filed: May 11, 2005

(65) Prior Publication Data
US 2006/0256530 A1  Nov. 16, 2006

(51) Int. Cl.
*H05K 7/20* (2006.01)
*F28F 7/00* (2006.01)
*H01L 23/34* (2006.01)
*B22F 3/02* (2006.01)
*B22D 25/00* (2006.01)
*B32B 5/18* (2006.01)

(52) U.S. Cl. ............ 361/704; 165/80.2; 165/80.3; 165/185; 257/707; 257/713; 257/720; 361/705; 361/708; 419/23; 428/313.5; 428/610

(58) Field of Classification Search .......... None
See application file for complete search history.

(56) References Cited

U.S. PATENT DOCUMENTS

| | | | | |
|---|---|---|---|---|
| 5,227,230 A | * | 7/1993 | McGlade | 428/319.1 |
| 5,738,936 A | * | 4/1998 | Hanrahan | 428/313.5 |
| 6,037,066 A | * | 3/2000 | Kuwabara | 428/610 |
| 6,116,495 A | * | 9/2000 | Richter et al. | 228/122.1 |
| 6,462,410 B1 | * | 10/2002 | Novotny et al. | 257/707 |
| 6,591,897 B1 | * | 7/2003 | Bhatti et al. | 165/80.3 |
| 6,657,297 B1 | * | 12/2003 | Jewram et al. | 257/720 |
| 6,911,728 B2 | * | 6/2005 | Ishikawa et al. | 257/706 |
| 7,083,759 B2 | * | 8/2006 | Osada et al. | 419/23 |
| 2006/0000591 A1 | * | 1/2006 | Adams et al. | 165/185 |

* cited by examiner

*Primary Examiner*—Gregory D Thompson
(74) *Attorney, Agent, or Firm*—Troxell Law Office, PLLC

(57) ABSTRACT

A 3D multi-layer heat conduction diffusion plate comprises at least one super conduction diffusion plate which is capable of quickly conducting heat energy, has a short cooling time, and can dissipate heat to a surrounding environment. A soft and bendable material capable of transmitting electrical signals or a fiber glass material capable of transmitting signals can be affixed on an upper and lower surface of the aforementioned super conduction diffusion plate. A micro-porous air-permeable ceramic plate having a high thermal conductivity, which is provided with irregularly arranged air-permeable holes can also be affixed to the aforementioned super conduction diffusion plate, so as to allow air to quickly conduct heat energy to the surrounding environment.

7 Claims, 10 Drawing Sheets

3D MULTI-LAYER HEAT CONDUCTION DIFFUSION PLATE

BACKGROUND OF THE INVENTION (a) Field of the Invention

The present invention relates to a 3D multi-layer heat conduction diffusion plate, and more particularly to a heat conduction diffusion plate which is different than a conventional heat dissipater using metallic copper or aluminum fins. The present invention includes at least one set of a super conduction diffusion plate (not using copper or aluminum) which is capable of quickly conducting heat energy, has a short cooling time (thermal conductivity greater than that of a copper material), and can dissipate heat to surrounding environment; at least one set of a soft and bendable material capable of transmitting electric signals and a fiber glass material capable of transmitting signals, which is affixed on an upper and lower surface of the aforementioned super conduction diffusion plate or a cuproplatinum plate; and at least one set of a micro-porous air-permeable ceramic plate having high thermal conductivity which is provided with irregularly arranged air-permeable holes in order to allow air to quickly conduct heat to surrounding environment, and is affixed on the aforementioned super conduction diffusion plate, thereby affixing the heat source on the aforementioned super conduction diffusion plate.

In addition, the 3D multi-layer heat conduction diffusion plate is a heat dissipating module composed of a plurality of layers of different heat dissipating materials and can be used along with various products of heat dissipating materials according to various working places and various conditions of heat dissipating, such that heat will not be easily concentrated on one location, heat source can be quickly dissipated to surrounding environment, and the heat dissipating module can be developed into more significant heat dissipating function and operating efficiency, when all kinds of various industrial products provided with heat source generate the heat.

(b) Description of the Prior Art

As shown in FIG. 1, a conventional heat dissipating device A using metallic platinum plates B capable of conducting and dissipating heat is provided as a heat dissipating device for a heating element C. However, as the heat dissipating device A is used for dissipating heat generated from the heating element C, the heat will not be dissipated uniformly and a heat source H can be easily concentrated on a fixed area, thus having a difficulty in quickly diffusing the heat to surrounding environment, thereby causing an overheating of the associated element C nearby, and reducing an operating efficiency of the product, due to the fact that the heat dissipating device A is made of metallic platinum plates B.

Furthermore, as there are various installation methods and heat dissipating structures in installing the conventional heat dissipating device A, therefore the compatibility in usage is low and a good effect of heat dissipating cannot be achieved.

Accordingly, how to eliminate the aforementioned drawbacks is a technical problem which needs to be solved by the inventor.

SUMMARY OF THE INVENTION

The primary object of the present invention is to provide a 3D multi-layer heat conduction diffusion plate which is composed of a super conduction diffusion plate, and a micro-porous air-permeable ceramic plate, as shown in FIG. 2.

The present invention includes at least one set of a super conduction diffusion plate (thermal conductivity greater than that of a copper material) which is capable of quickly conducting heat and has a short cooling time, and can dissipate heat to surrounding environment; at least one set of a soft and bendable material capable of transmitting electric signals and a fiber glass material capable of transmitting signals, which is affixed on an upper and lower surface of the super conduction diffusion plate; and at least one set of a micro-porous air-permeable ceramic plate having high thermal conductivity which is provided with irregularly arranged air-permeable holes in order to allow air to quickly conduct heat to surrounding environment, and is affixed on the aforementioned super conduction diffusion plate.

Referring to FIG. 3 and FIG. 5, the heat dissipating method consists of affixing a heat source on an upper surface of the aforementioned super conduction diffusion plate, so as to expel heat energy generated from the heat source from an upper, lower, left, right, front, rear, and peripheral direction through an solid angle formed by the 3D multi-layer heat conduction diffusion plate.

In addition, the 3D multi-layer heat conduction diffusion plate is a heat dissipating module assembled with a plurality of layers of different heat dissipating materials and can be used along with various products of heat dissipating materials according to various working places and various conditions of heat dissipating, such that heat will not be easily concentrated on one location, heat source can be quickly dissipated to surrounding environment and the heat dissipating module can be developed into more significant heat dissipating function and operating efficiency, when all kinds of various industrial products with the heat source generate the heat.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
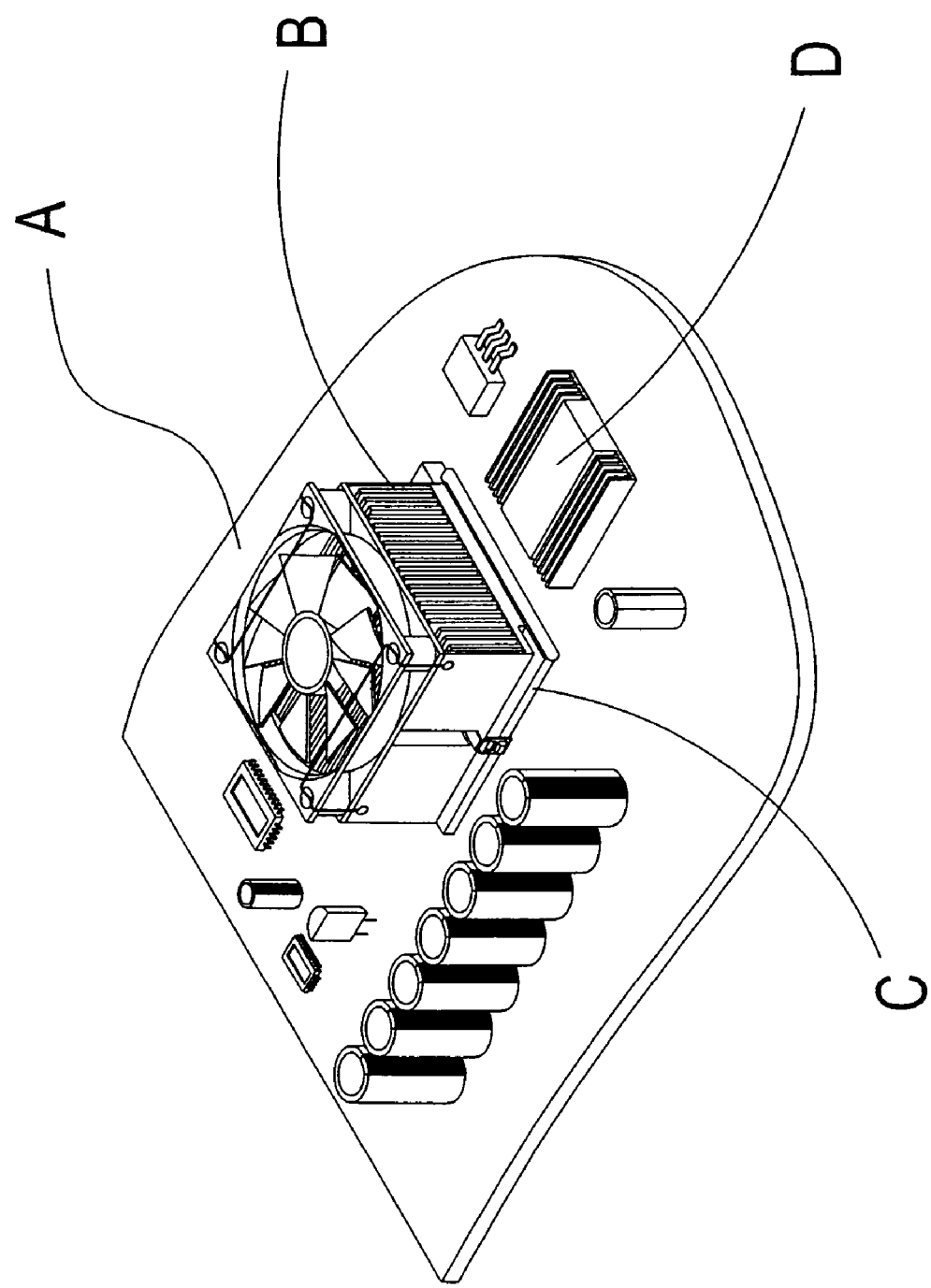
FIG. 1 shows a perspective view of a conventional application.
Figure 2:
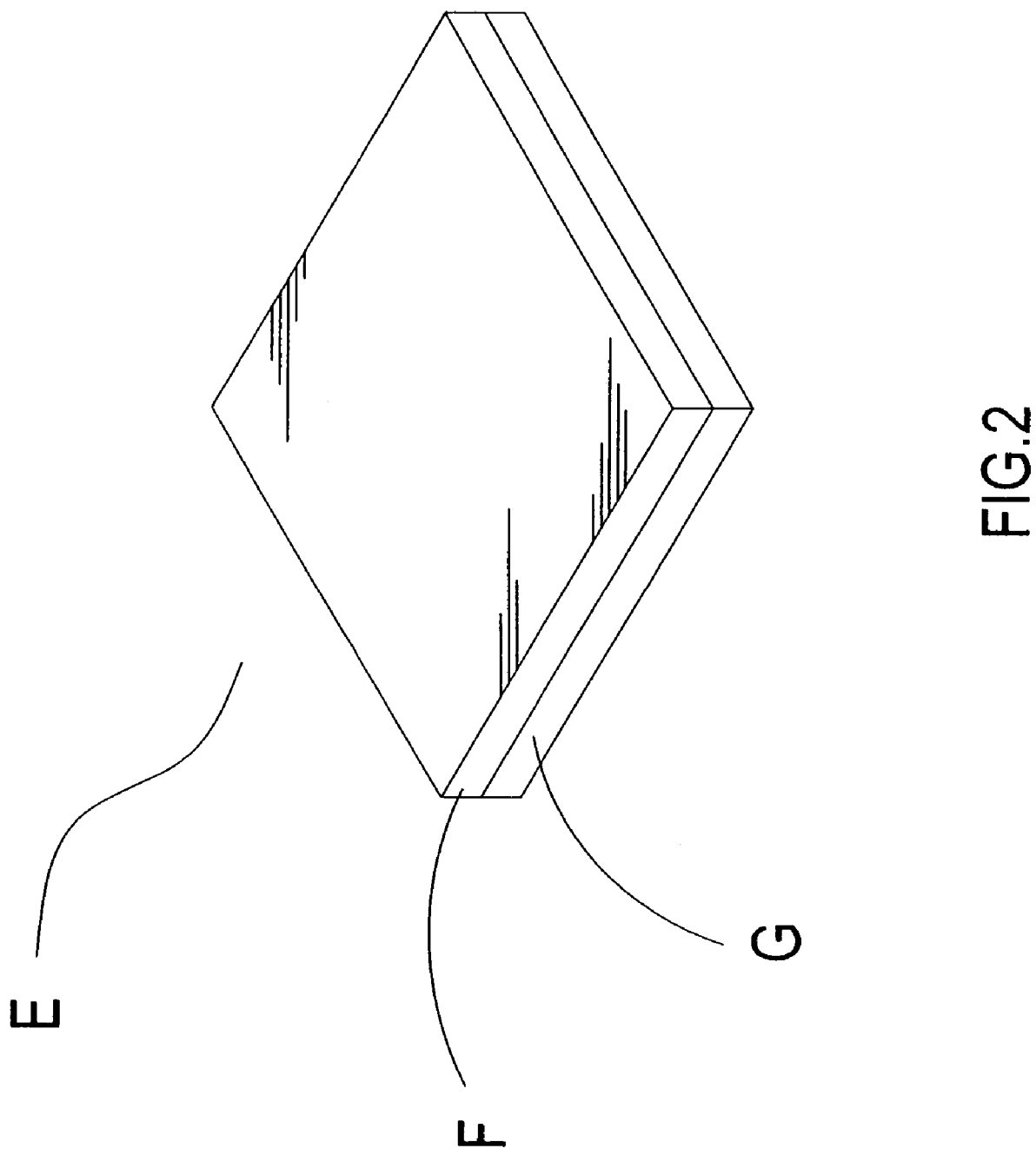
FIG. 2 shows a perspective view of the present invention.
Figure 3:
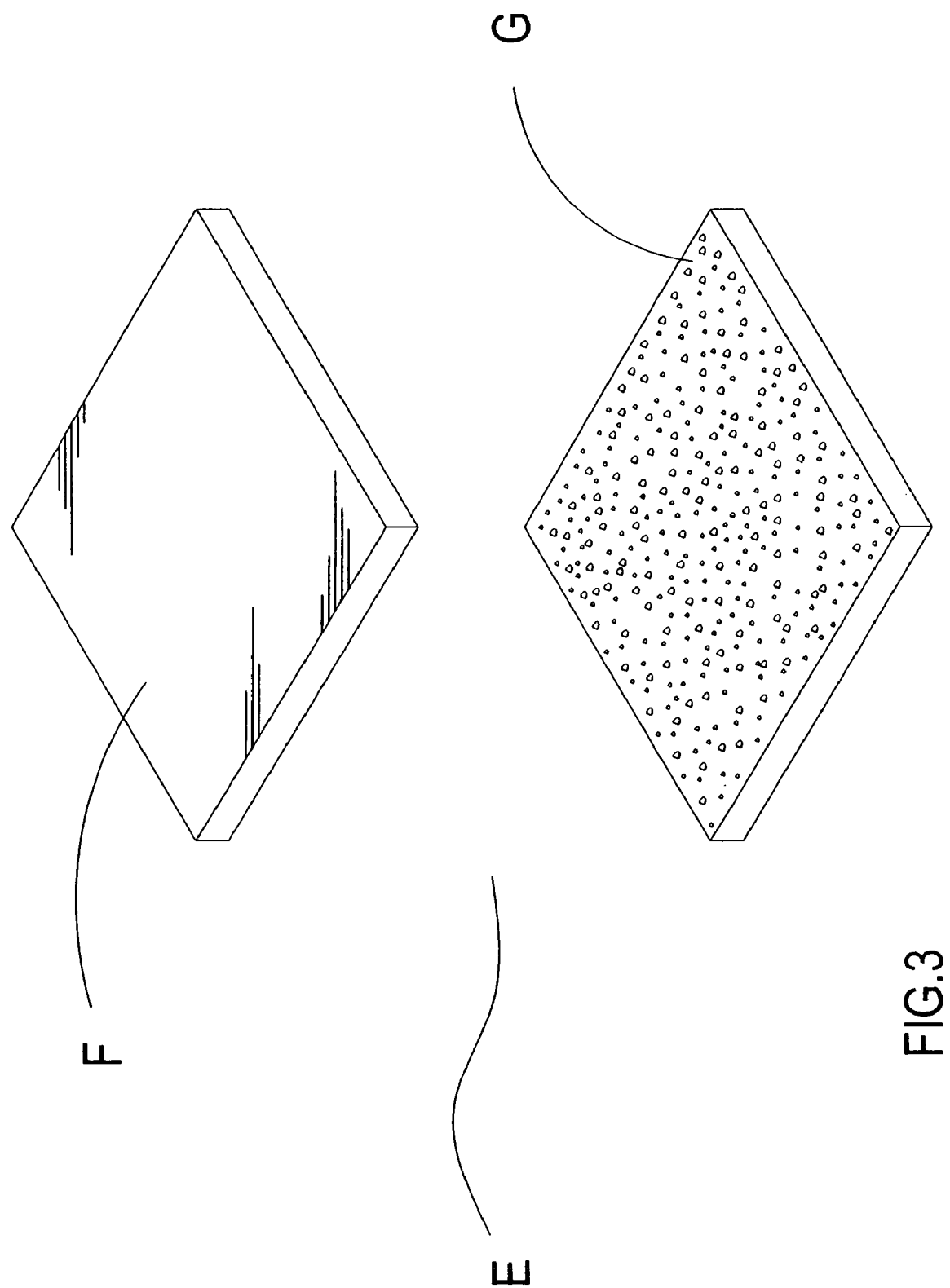
FIG. 3 shows a schematic view of compartments of the present invention.
Figure 4:
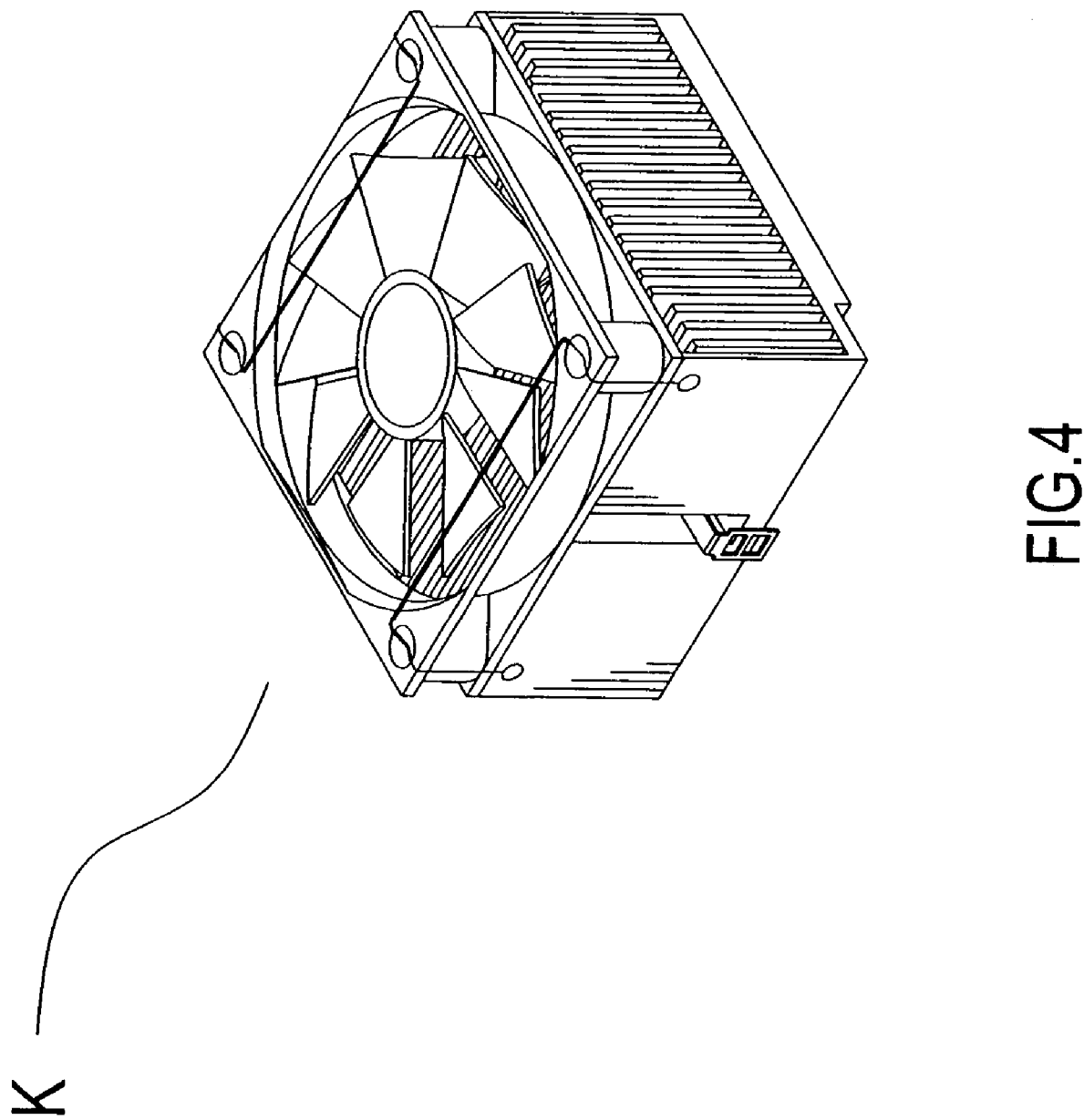
FIG. 4 shows a perspective view of an implementation of the present invention.
Figure 5:
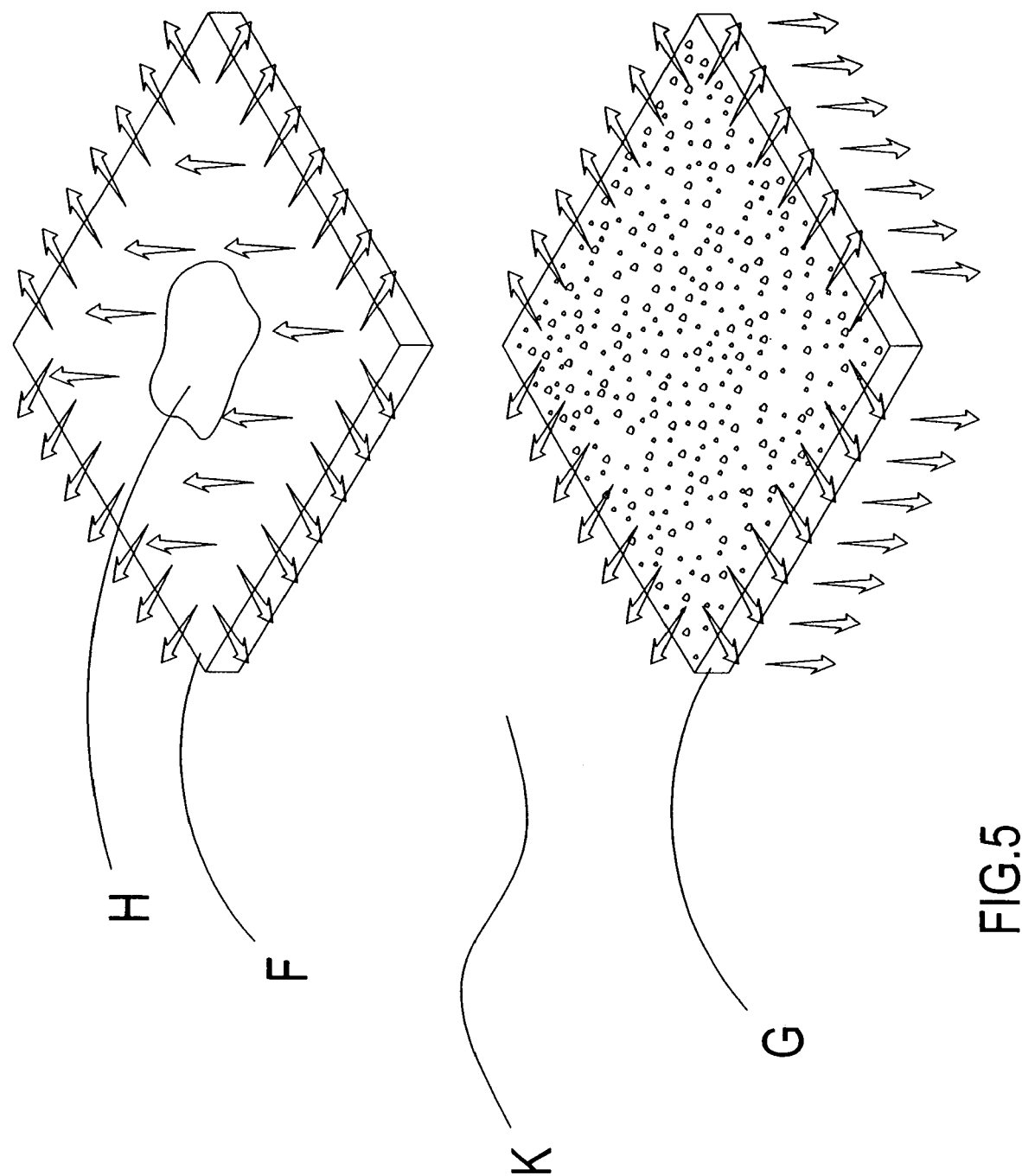
FIG. 5 shows a schematic view of compartments of an implementation of the present invention.

Referring to FIG. 4 and FIG. 5, it shows an implementation method of the present invention. In using the present invention, a super conduction diffusion plate F can be assembled with a micro-porous air-permeable ceramic plate G into a double-layer heat conduction diffusion module K for application to a high power LED (Light Emitting Diode), a CPU (Central Processing Unit) interface circuit, a VGA (Video Graphics Array) card interface circuit, and other related electronic product that can generate heat source H, such that the double-layer heat conduction diffusion module K can be developed into more significant heat dissipating function and an operating efficiency can be increased upon operating an electronic product provided with the heat source H.

Figure 6:
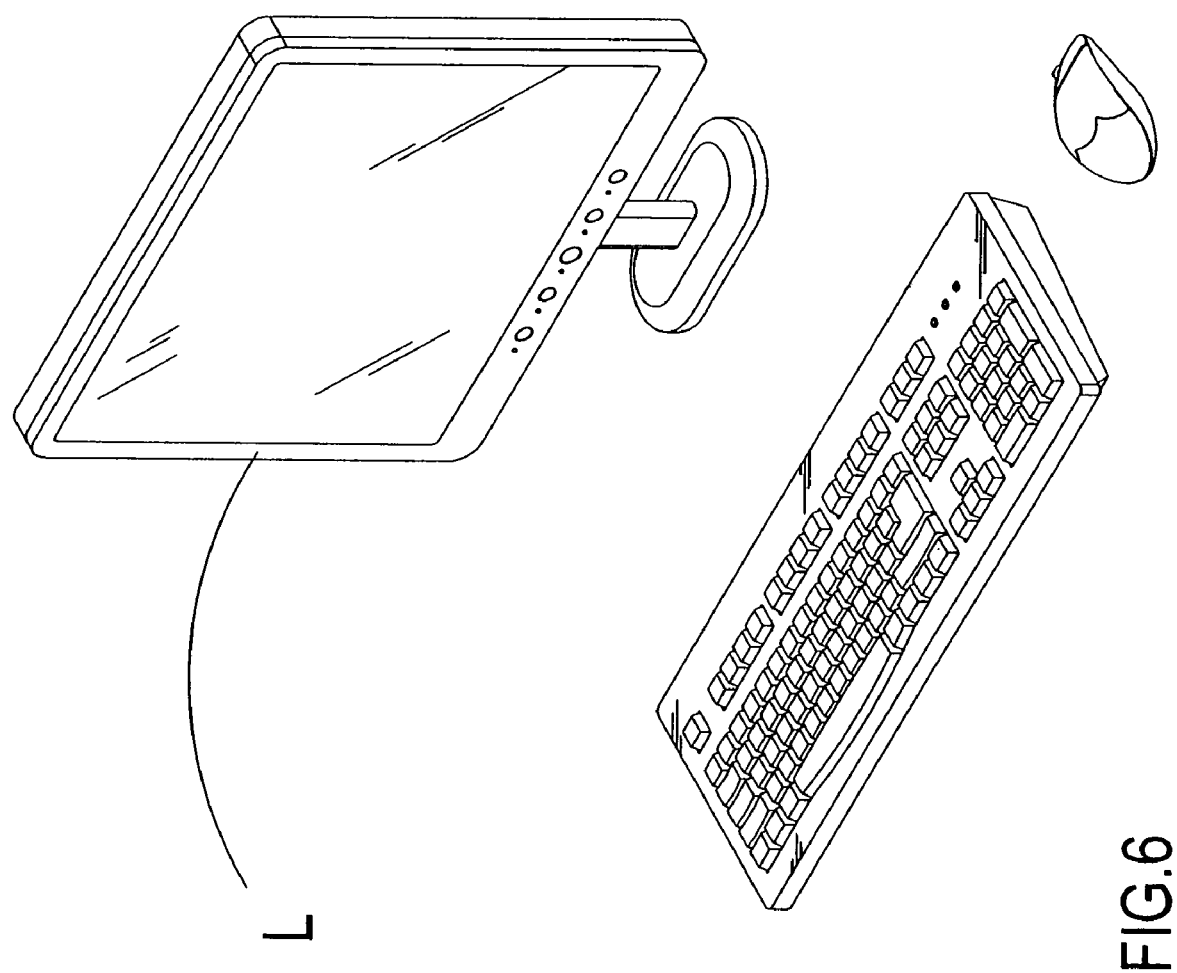
FIG. 6 shows a perspective view of a second implementation of the present invention.
Figure 7:
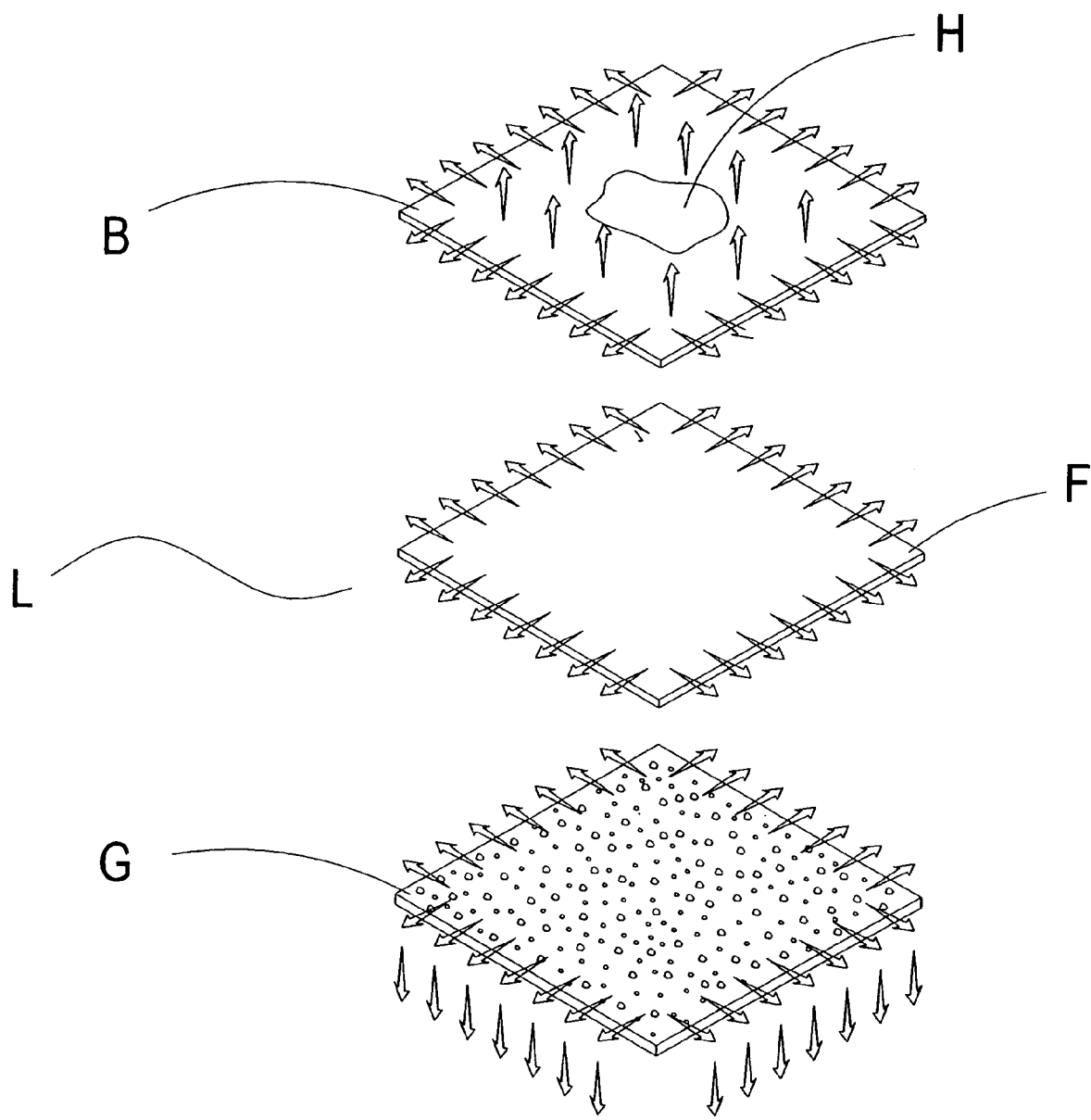
FIG. 7 shows a schematic view of compartments of a second implementation of the present invention.

Referring to FIG. 6 and FIG. 7, an electrically conductible metallic cuproplatinum circuit B is mounted on a top surface of the super conduction diffusion plate F and the micro-porous air-permeable ceramic plate G, so as to constitute a three-layer heat conduction diffusion module L for application to all kinds of circuit chip I, TFT-TV (Thin Film Transistor-TV) liquid crystal back light source, PDP-TV (Plasma Display Panel-TV) liquid crystal back light source, and related products having heat source H, such that the three-layer heat conduction diffusion module K can be developed into more significant heat dissipating function and an operating efficiency can be increased upon operating a product provided with the heat source H.

Figure 8:
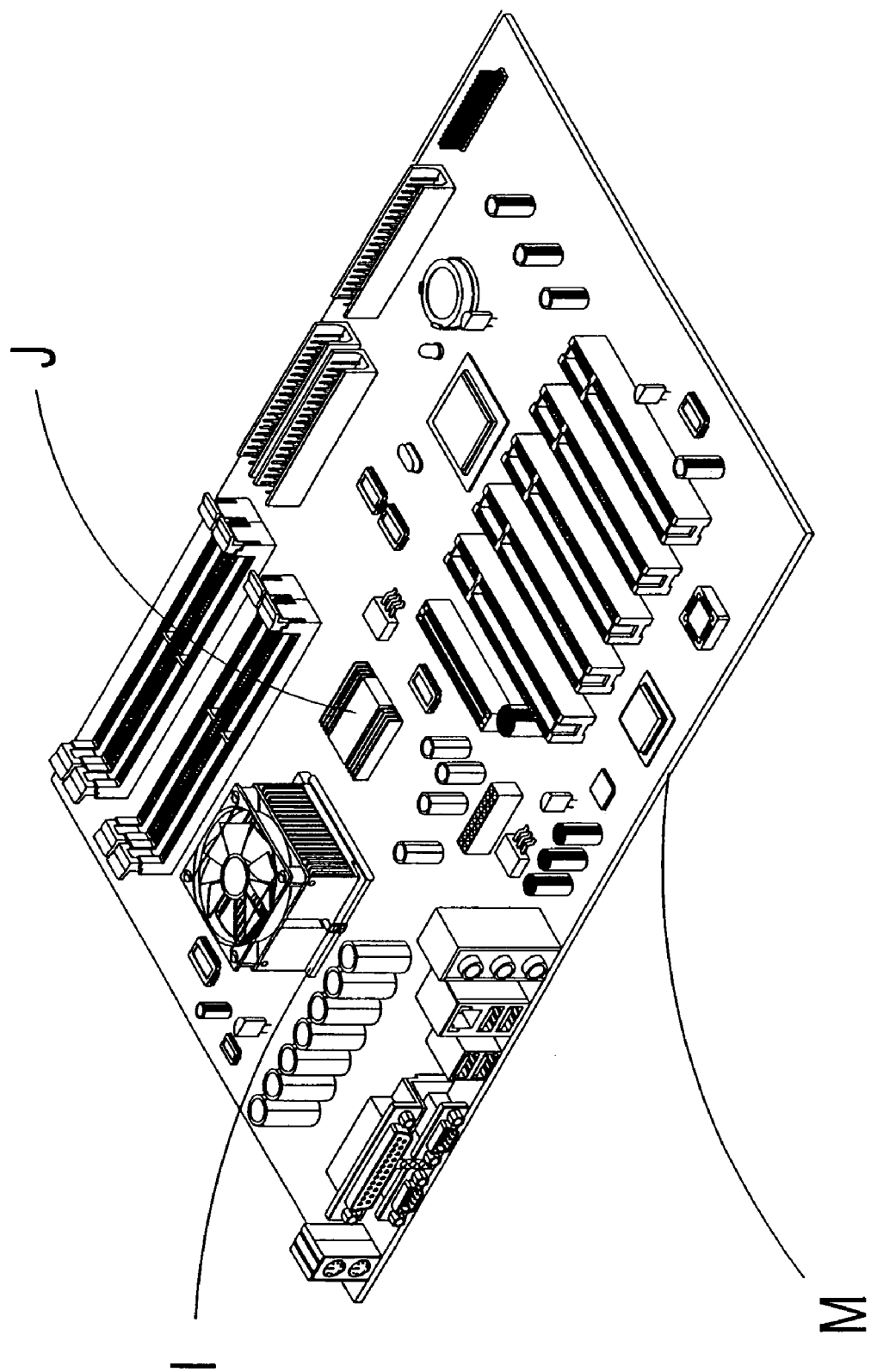
FIG. 8 shows a perspective view of a third implementation of the present invention.
Figure 9:
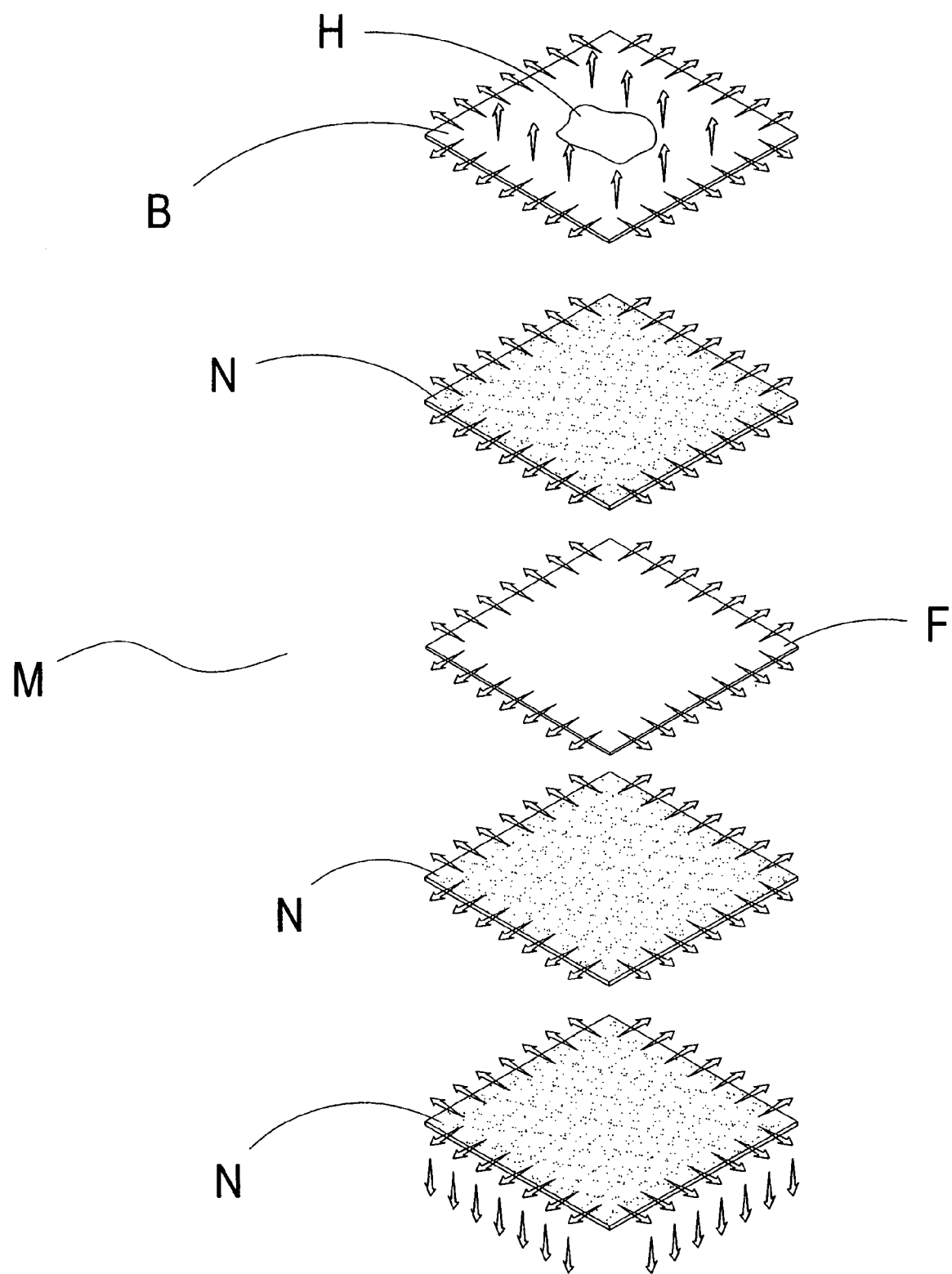
FIG. 9 shows a schematic view of compartments of a third implementation of the present invention.
Figure 10:
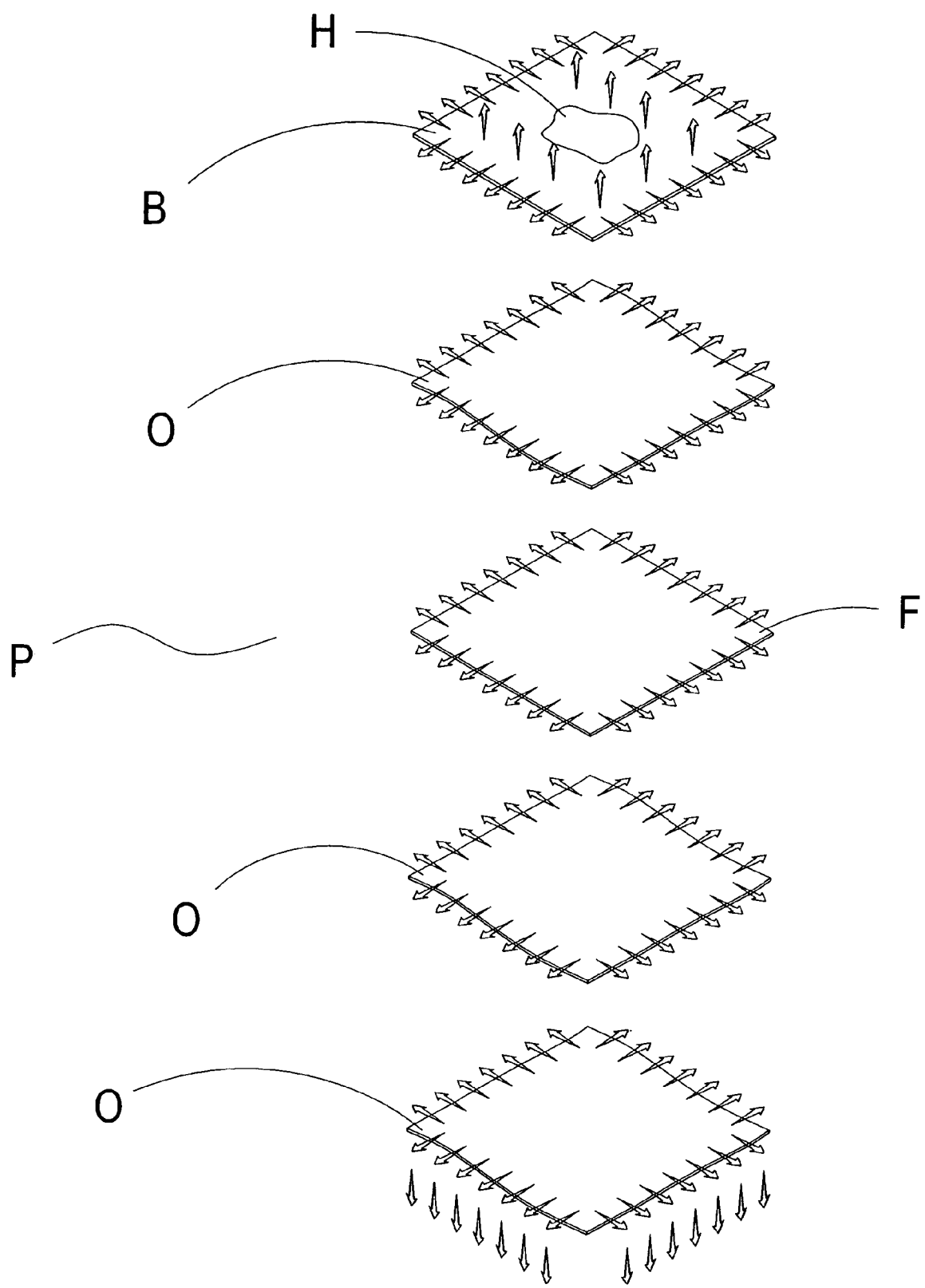
FIG. 10 shows a schematic view of compartments of a fourth implementation of the present invention.

Referring to FIG. 8, FIG. 9, and FIG. 10, a plurality of layers of an electrically conductible fiber glass material N having a transmission circuit (Printed Circuit Board) and a soft and bendable material O is installed between the super conduction diffusion plate F and the electrically conductible metallic cuproplatinum circuit B, so as to constitute a multi-layer heat dissipation and electrically conductible module M, P for application to a multi-power circuit board, an industrial computer motherboard, a CPU (Central Processing Unit), a general-purpose computer motherboard, and related boards provided with a circuit motherboard, such that the multi-layer heat dissipating and electrically conductible module M, P can be developed into an effect of heat dissipating and electric conducting, and an operating efficiency of chips on a motherboard can be increased upon operating the aforementioned circuit motherboards.

In addition, for the heat dissipating method of the multi-layer heat dissipating and electrically conductible module M, P, the super conduction diffusion plate F is used to diffuse heat source H generated between a circuit chip I and an associated element J through a 3D solid angle, such that the super conduction diffusion plate F can achieve a best performance of heat dissipating upon developing a heat dissipating function.

To emphasize the advancement and practicability of the present invention, the comparison with the conventional application is provided below:

Shortcoming of the Conventional Application

Heat source is too concentrated; therefore the effect of heat dissipating is inferior.

Heat is not uniformly dissipated, thereby affecting a lifetime of usage of an element.

A cooling time of metallic copper and aluminum material is too long, thereby being unable to instantly diffuse a heat source.

A heat dissipating device is in a fixed shape, thereby being unable to apply to all kinds of devices.

A space of heat dissipating is required, thereby being unable to achieve a good heat dissipating effect.

Advantage of the Present Invention

It can be applied to all kinds of various circuit devices and electronic products.

It has a good heat dissipating function and a short cooling time (thermal conductivity greater than that of a copper material).

There is no limitation to size, and it is compact, delicate, and extremely thin.

It can be used to replace a copper or aluminum material used in a conventional heat dissipater.

It is provided with a good heat dissipating and diamagnetic effect.

Heat is dissipated uniformly; therefore, a lifetime of usage of an element will not be affected.

It is provided with advancement and practicability.

It can improve industrial competitiveness.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A 3D multi-layer conduction diffusion plate comprising:
at least one super conduction diffusion plate configured to dissipate heat to a surrounding environment; and
a micro-porous air-permeable ceramic plate, affixed to and underlying the at least one conduction diffusion plate, the ceramic plate having a high thermal conductivity and being provided with irregularly arranged air-permeable holes to allow air to quickly conduct heat to the surrounding environment,
wherein the 3D multi-layer conduction diffusion plate is configured to expel in all directions heat energy generated from a heat source, when the heat source is affixed to the 3D multi-layer conduction diffusion plate.

2. The 3D multi-layer heat conduction diffusion plate according to claim 1, further comprising a cuproplatinum plate affixed to an upper layer of the super conduction diffusion plate.

3. The 3D multi-layer heat conduction diffusion plate according to claim 1, wherein the at least one super conduction diffusion plate comprises multiple super conduction diffusion plates and the ceramic plate is sandwiched between these multiple ceramic plates.

4. The 3D multi-layer heat conduction diffusion plate according to claim 1, wherein the heat source is selected from the group consisting of:
a high power LED, a VGA card display interface circuit, a TFT-TV liquid crystal television set, a PDP-TV plasma television set, a CPU, a general-purpose computer, an industrial computer, a power supply, and a server.

5. A 3D multi-layer conduction diffusion plate comprising:
a super conduction diffusion plate configured to dissipate heat to a surrounding environment;
a soft and bendable material capable of transmitting electric signals or a fiber glass material capable of transmitting signals affixed on an upper and lower surface of the aforementioned super conduction diffusion plate,
wherein the 3D multi-layer conduction diffusion plate is configured to expel in all directions heat energy generated from a heat source, when the heat source is affixed to the 3D multi-layer conduction diffusion plate.

6. The 3D multi-layer heat conduction diffusion plate according to claim 5, further comprising a cuproplatinum plate overlying and contacting an uppermost layer of the soft and bendable material or the fiber glass material.

7. The 3D multi-layer heat conduction diffusion plate according to claim 5, wherein the heat source is selected from the group consisting of:
a high power LED, a VGA card display interface circuit, a TFT-TV liquid crystal television set, a PDP-TV plasma television set, a CPU, a general-purpose computer, an industrial computer, a power supply, and a server.

* * * * *